(12) United States Patent
Lee et al.

(10) Patent No.: US 7,277,288 B2
(45) Date of Patent: Oct. 2, 2007

(54) HEAT SINK ASSEMBLY WITH RETENTION MODULE AND CLIP

(75) Inventors: Hsieh Kun Lee, Tu-Chen (TW); WanLin Xia, Shenzhen (CN); Gen-Cai Wang, Shenzhen (CN); Tao Li, Shenzhen (CN)

(73) Assignees: Fu Zhun Precision Ind. (Shenzhen) Co., Ltd., Shenzhen (CN); Foxconn Technology Co., Ltd., Tu-Cheng (TW)

( * ) Notice: Subject to any disclaimer, the term of this patent is extended or adjusted under 35 U.S.C. 154(b) by 394 days.

(21) Appl. No.: 10/629,232

(22) Filed: Jul. 28, 2003

(65) Prior Publication Data

US 2004/0105236 A1 Jun. 3, 2004

(30) Foreign Application Priority Data

Nov. 29, 2002 (TW) ............................ 91219298 U

(51) Int. Cl.
*H05K 7/20* (2006.01)
(52) U.S. Cl. ................ 361/704; 361/710; 361/719; 361/709
(58) Field of Classification Search ................ 361/600, 361/679, 688, 695–697, 701, 702, 703, 704, 361/707, 709, 710, 717, 718, 719; 165/80.1, 165/80.2, 80.3; 257/705, 706, 707, 713, 257/717, 718, 719; 24/456
See application file for complete search history.

(56) References Cited

U.S. PATENT DOCUMENTS

| 654,879 | A | * | 7/1900 | Dineen | 141/284 |
|---|---|---|---|---|---|
| 5,208,731 | A | * | 5/1993 | Blomquist | 361/704 |
| 5,381,305 | A | * | 1/1995 | Harmon et al. | 361/704 |
| 5,384,940 | A | * | 1/1995 | Soule et al. | 24/453 |
| 5,396,402 | A | * | 3/1995 | Perugini et al. | 361/704 |
| 5,734,556 | A | * | 3/1998 | Saneinejad et al. | 361/719 |
| 5,804,875 | A | * | 9/1998 | Remsburg et al. | 257/718 |
| 5,833,472 | A | * | 11/1998 | Bright | 439/70 |
| 5,870,286 | A | * | 2/1999 | Butterbaugh et al. | 361/704 |
| 6,205,026 | B1 | | 3/2001 | Wong et al. | |
| 6,209,623 | B1 | * | 4/2001 | Tantoush | 165/80.3 |
| 6,381,813 | B1 | * | 5/2002 | Lai | 24/456 |
| 6,396,696 | B1 | * | 5/2002 | Lin et al. | 361/704 |
| 6,466,443 | B1 | * | 10/2002 | Chen | 361/695 |
| 6,487,079 | B2 | * | 11/2002 | Katsui | 361/704 |
| 6,542,369 | B1 | * | 4/2003 | Wu | 361/704 |
| 6,549,412 | B1 | * | 4/2003 | Ma | 361/704 |

(Continued)

Primary Examiner—Jayprakash Gandhi
Assistant Examiner—Ingrid Wright
(74) Attorney, Agent, or Firm—Wei Te Chung

(57) ABSTRACT

A heat sink assembly of the present invention includes a printed circuit board (10), a retention module (20), four pins (30), a heat sink (40) and a clip (50). The printed circuit board (10) has an electronic package (100) mounted thereon. The retention module (20) is integrally formed, substantially rectangular, and has a symmetrical configuration. The retention module (20) defines an opening (26) therein for surrounding the electronic package (100). Four positioning holes (28) are defined in four corners of the retention module (20). In assembly of the heat sink assembly, the pins (30) are interferentially positioned in the positioning holes (28) of the retention module (20). Portions of the pins (30) extending out beyond the retention module (20) are welded to the printed circuit board (10). The clip (50) cooperates with the retention module (20) to press the heat sink (40) against the electronic package (100).

16 Claims, 6 Drawing Sheets

U.S. PATENT DOCUMENTS

| | | |
|---|---|---|
| 6,570,763 B1 * | 5/2003 | McHugh et al. ............. 361/704 |
| 6,574,109 B1 * | 6/2003 | McHugh et al. ............. 361/719 |
| 6,611,431 B1 * | 8/2003 | Lee et al. ................... 361/719 |
| 6,621,704 B1 * | 9/2003 | Liu ............................. 361/704 |
| 6,639,800 B1 * | 10/2003 | Eyman et al. .............. 361/704 |
| 6,639,804 B1 * | 10/2003 | Chen .......................... 361/719 |
| 6,644,396 B2 * | 11/2003 | Liang ......................... 165/185 |
| 6,728,103 B1 * | 4/2004 | Smedberg ................... 361/703 |
| 6,741,470 B2 * | 5/2004 | Isenburg .................... 361/704 |
| 6,778,396 B2 * | 8/2004 | Liu ............................. 361/719 |
| 6,809,929 B2 * | 10/2004 | Liu ............................. 361/704 |
| 6,859,367 B2 * | 2/2005 | Davison ..................... 361/704 |
| 2004/0190258 A1 * | 9/2004 | Lofland et al. ............. 361/704 |

* cited by examiner

HEAT SINK ASSEMBLY WITH RETENTION MODULE AND CLIP

BACKGROUND OF THE INVENTION

1. Field of the Invention

The present invention relates to heat sink assemblies, and more particularly to a heat sink assembly for removing heat from an electronic package.

2. Description of Related Art

Typically, a heat sink assembly for an electronic package comprises a pair of retention modules cooperating with a pair of heat sink clips to position the heat sink on the electronic package. The retention modules are separately attached onto a printed circuit board by fasteners, at opposite sides of a socket on which the electronic package is mounted.

An example of such heat sink assembly is disclosed in U.S. Pat. No. 6,205,026. Each retention module forms catches for engaging with corresponding clip to secure the heat sink to the electronic package. Each retention module comprises a frame having a substantially U-shaped cross-section, and a locating portion perpendicular to the frame. The two retention modules face each other and cooperatively surround the electronic package. A pair of through holes is defined in the locating portion of each retention module, for insertion of two fasteners therethrough. Each fastener defines a central hole for insertion of a pin thereinto. An end of each fastener forms a hood, and defines a central cutout spanning alongside the central hole. It is unduly difficult to manufacture the fasteners having the central holes with the above-described configuration. In addition, the retention modules have relatively complicated structures.

An improved heat sink assembly is desired to overcome the above-described disadvantages of the related art.

SUMMARY OF THE INVENTION

Accordingly, an object of the present invention is to provide a heat sink assembly which has a simple retention module securely attached on a printed circuit board to facilitate attachment of a heat sink to an electronic package.

In order to achieve the object set out above, a heat sink assembly in accordance with the present invention comprises a printed circuit board, a retention module, four pins, a heat sink and a clip. The printed circuit board has an electronic package mounted thereon. The retention module is integrally formed, substantially rectangular, and has a symmetrical configuration. The retention module defines an openings therein for surrounding the electronic package. Four positioning holes are defined in four corners of the retention. In assembly of the heat sink assembly, the pins are interferentially positioned in the positioning holes of the retention module. Portions of the pins extending out beyond the retention module are welded to the printed circuit board. The clip cooperates with the retention module to press the heat sink against the electronic package. Alternatively, the retention module may be round, or another shape according to a particular shape selected for the heat sink. Whatever shape the retention module takes, it must define at least a pair of positioning holes at symmetrically opposite sides of a center thereof Additionally, each positioning hole can be a through hole or a blind hole. The pins may be welded or interferentially received into the positioning holes. Moreover, the pins may be integrally formed from or directly welded to a surface of the retention module facing the printed circuit board.

Other objects, advantages and novel features of the present invention will become more apparent from the following detailed description when taken in conjunction with the accompanying drawings, in which:

DETAILED DESCRIPTION OF THE INVENTION

Figure 1:
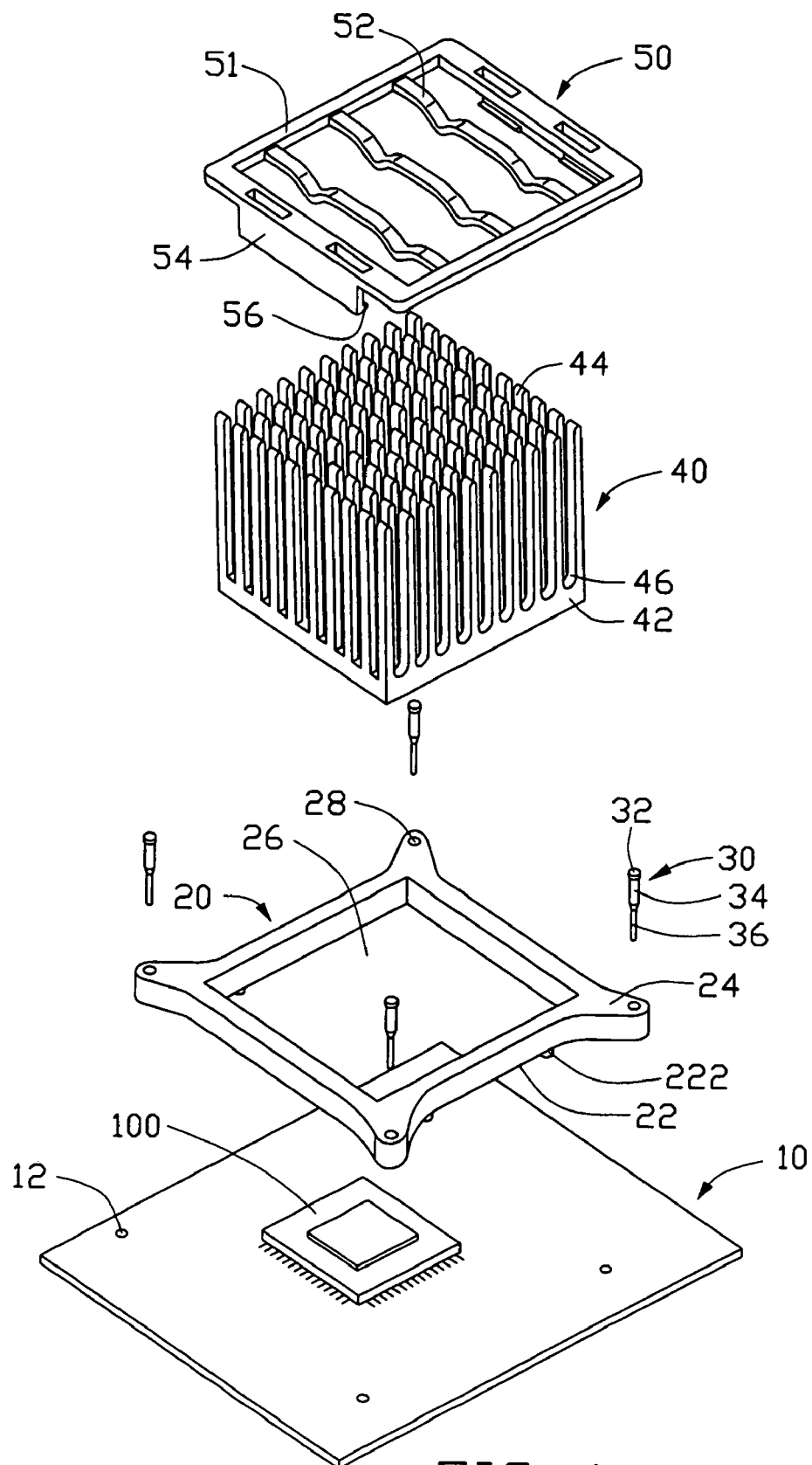
FIG. 1 is an exploded, isometric view of a heat sink assembly in accordance with a preferred embodiment of the present invention.

Reference will now be made to the drawing figures to describe the present invention in detail.

Figure 2:
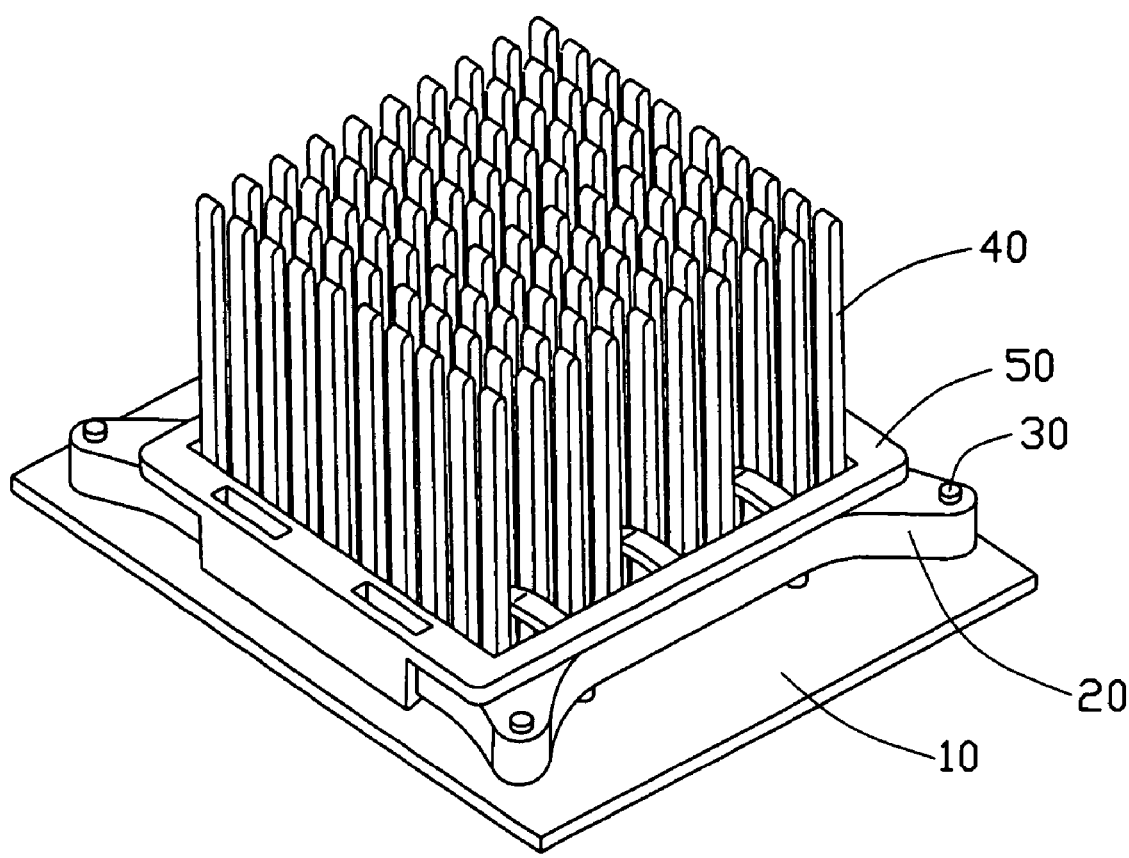
FIG. 2 is an assembled view of FIG. 1.

Referring to FIGS. 1-2, a heat sink assembly in accordance with the preferred embodiment of the present invention comprises a printed circuit board (PCB) 10, a retention frame 20, four pins 30, a heat sink 40 and a heat sink clip 50. The retention module 20 is fixable to the PCB 10 by using the pins 30. The heat sink 40 is pressed by the clip 50 against an electronic package 100 that is mounted on the PCB 10.

The PCB 10 defines four locating holes 12 therein surrounding the electronic package 100. The heat sink 40 comprises a base 42 attached on a top surface of the electronic package 100, and a rectangular array of pin fins 44 extending upwardly from the base 42. Parallel rows of the fins 44 define a plurality of parallel channels 46 therebetween. The clip 50 is made of plastic, and comprises a rectangular frame 51 integrally forming a plurality of transverse pressing beams 52 therein. A pair of legs 54 depends from opposite ends of the frame 51 respectively. Each leg 54 has an inner hook 56 at a distal end thereof.

The retention module 20 is integrally formed, substantially rectangular, and has a symmetrical configuration. The retention module 20 comprises a first surface 22 facing the PCB 10, and a second surface 24 opposite from the first surface 22. An opening 26 is defined in a middle of the retention module 20 between the first and second surfaces 22, 24. The retention module 20 can therefore surround the electronic package 100, and receive the base 42 of the heat sink 40 in the opening 26. A positioning hole 28 is defined in each of four corners of the retention module 20 between the first and second surfaces 22, 24. The positioning holes 28 correspond to and are larger than the locating holes 12 of the PCB 10. Two pairs of standoffs 222 depend from the first surface 22 of the retention module 20 at opposite sides of the opening 26 respectively, for isolating a bulk of the retention module 20 from the PCB 10.

Each pin 30 sequentially comprises a top blocking portion 32, an intermediate connecting portion 34 and a bottom welding portion 36, each sequentially having successively reduced diameters. The blocking portions 36 of the pins 30 abut against the second surface 24 of the retention module 20. The connecting portions 34 are inserted through the positioning holes 28 of the retention module 20. The welding portions 36 are welded in the locating holes 12 of the PCB 10.

In assembly, the pins 30 are interferentially inserted through the positioning holes 28 of the retention module 20 until the blocking portions 32 abut against the second surface 24. At this stage, the connecting portions 34 are lodged in the positioning holes 28, and the welding portions 36 extend out beyond the first surface 22. The retention module 20 is then placed on the PCB 10, with the pins 30 being inserted into the locating holes 12. The standoffs 222 of the retention module 20 are supported on the PCB 10, thereby isolating the bulk of the retention module 20 from the PCB 10. The welding portions 36 are welded in the locating holes 12, thereby fixing the retention module 20 to the PCB 10. The base 42 of the heat sink 40 is received into the opening 26 of the retention module 20 and placed on the top surface of the electronic package 100. The clip 50 is placed on the heat sink 40 such that the pressing beams 52 of the clip 50 are received in corresponding channels 46 and rest on the base 42 of the heat sink 40. The frame 51 is depressed, and the legs 54 move down past the retention module 20 until the hooks 56 snappingly clasp the first surface 22 of the retention module 20. As a result, the heat sink 40 firmly abuts against the electronic package 100, and can efficiently remove heat therefrom A number of variations of the above-described preferred embodiment can be adopted. For example, the retention module 20 may be round or another shape according to a particular shape selected for the heat sink 40. Whatever shape the retention module 20 takes, it must define at least a pair of positioning holes 28 at symmetrically opposite sides of a center thereof. Additionally, each positioning hole 28 may instead be a blind hole not reaching the second surface 24 of the retention module 20. In such case, one end of each pin 30 can be welded or interferentially received in a corresponding such blind hole in advance. Furthermore, each pin 30 may have other modifications such as a different length or diameter according to actual requirements. Moreover, the pins 30 may be integrally formed from or directly welded to the first surface 22 of the retention module 20.

Figure 3:
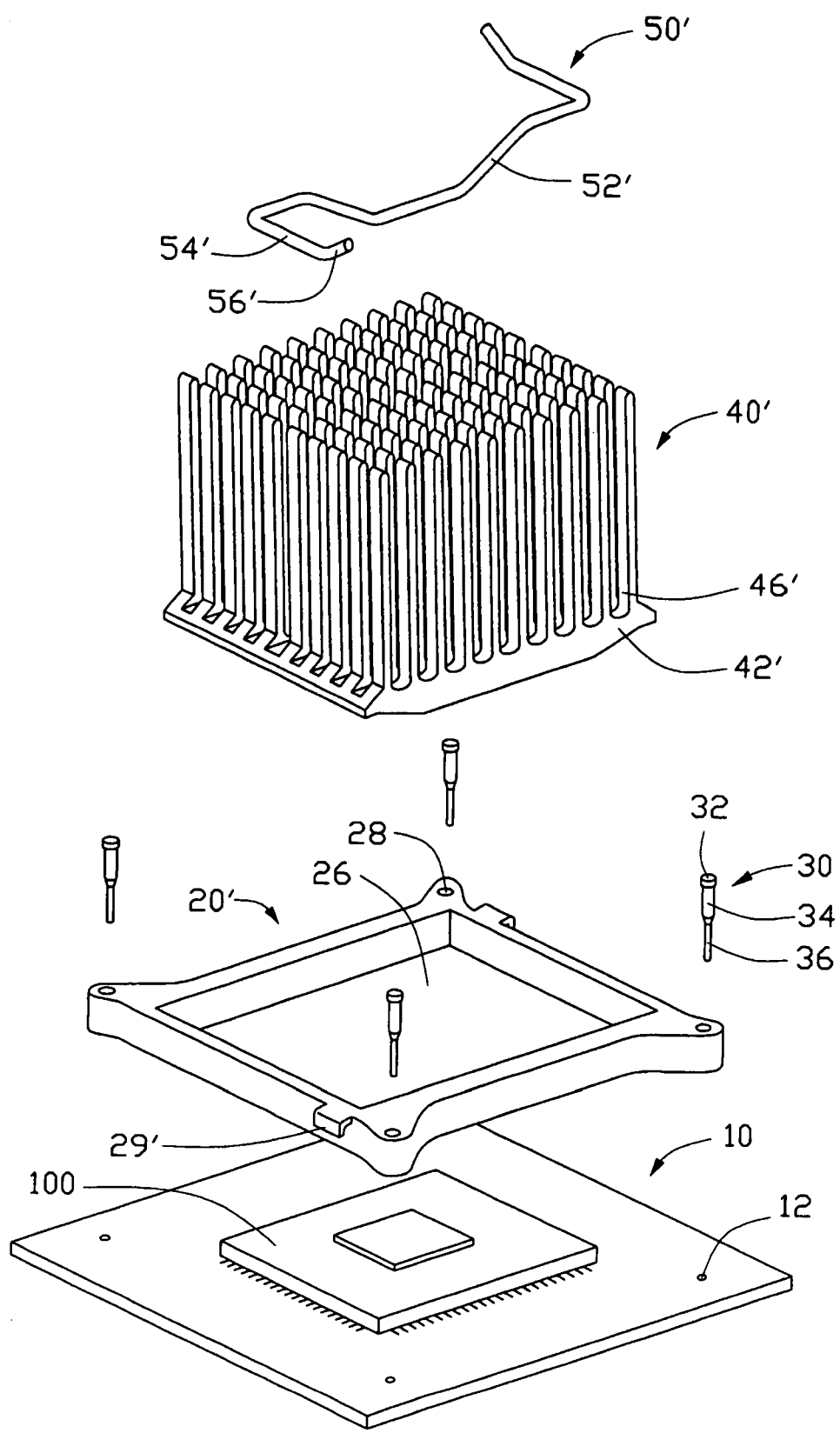
FIG. 3 is an exploded, isometric view of a heat sink assembly in accordance with an alternative embodiment of the present invention.
Figure 4:
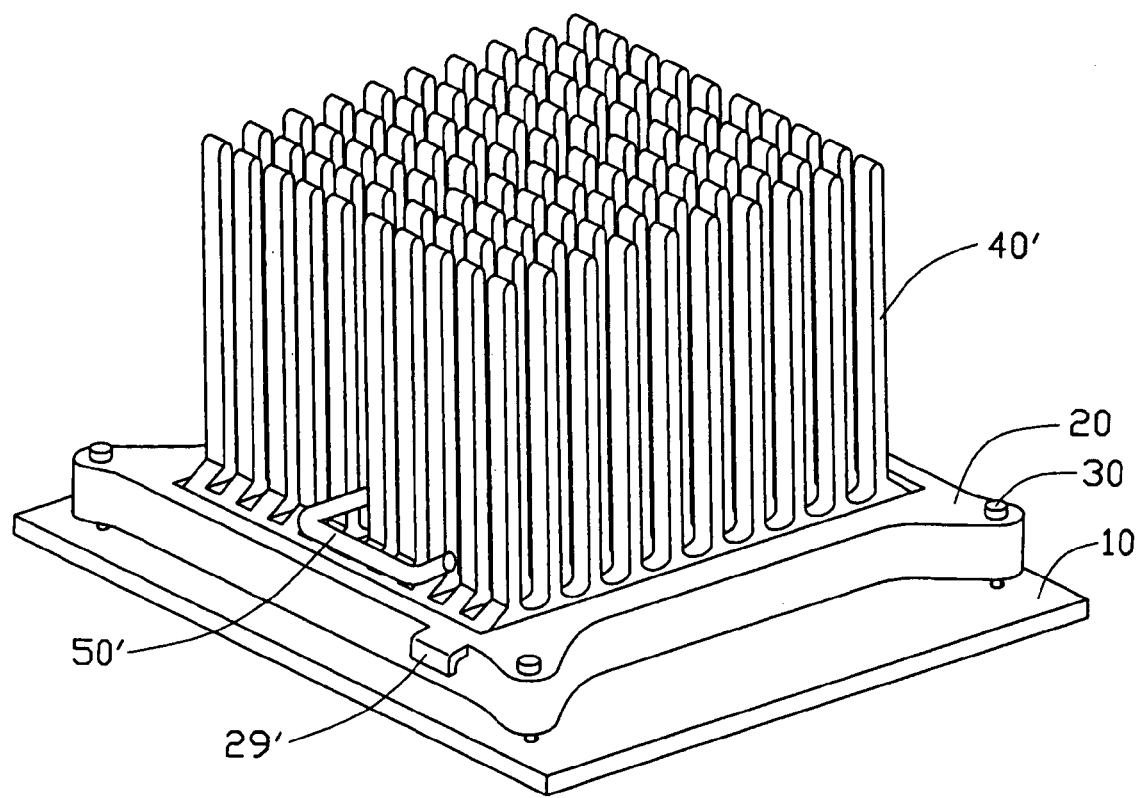
FIG. 4 is a substantially assembled view of FIG. 3.

Referring to FIGS. 3-4, a heat sink assembly in accordance with an alternative embodiment of the present invention is similar to the heat sink assembly of the preferred embodiment, except for the following. A pair of catches 29' is integrally formed outwardly from a retention module 20' at diagonally opposite corners thereof respectively. The clip 50' is essentially a bent wire or piece of wire like material. The clip 50' comprises an elongated pressing beam 52', and a pair of legs 54' extending in opposite directions from respective opposite ends of the pressing beam 52'. A hook 56' is formed at a distal end of each leg 54'. In assembly, the pressing beam 52' is received in a corresponding channel 46', and rests on a base 42' of a heat sink 40'. The hooks 56' engage with undersides of the catches 29'.

Figure 5:
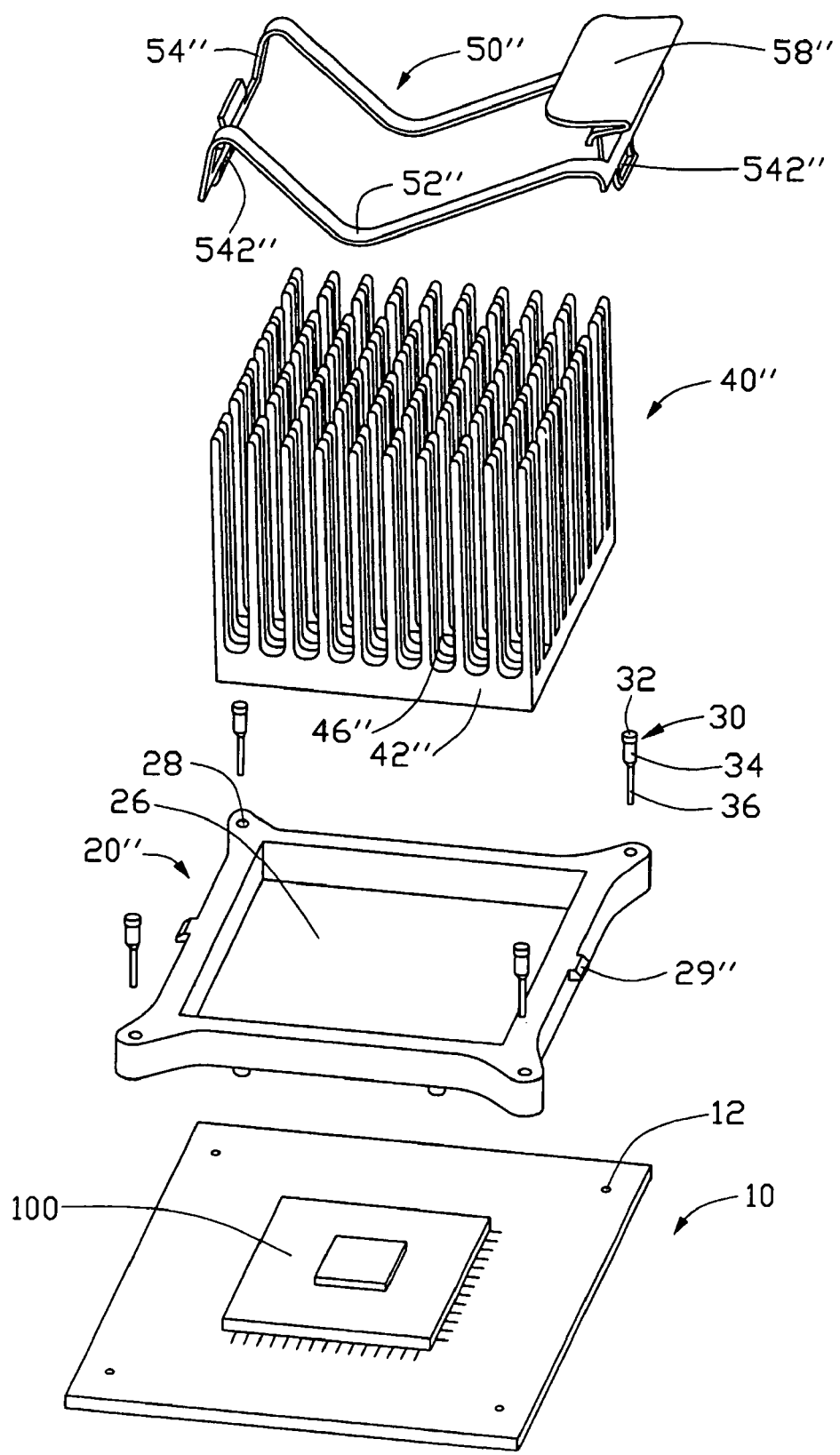
FIG. 5 is an exploded, isometric view of a heat sink assembly in accordance with a further alternative embodiment of the present invention.
Figure 6:
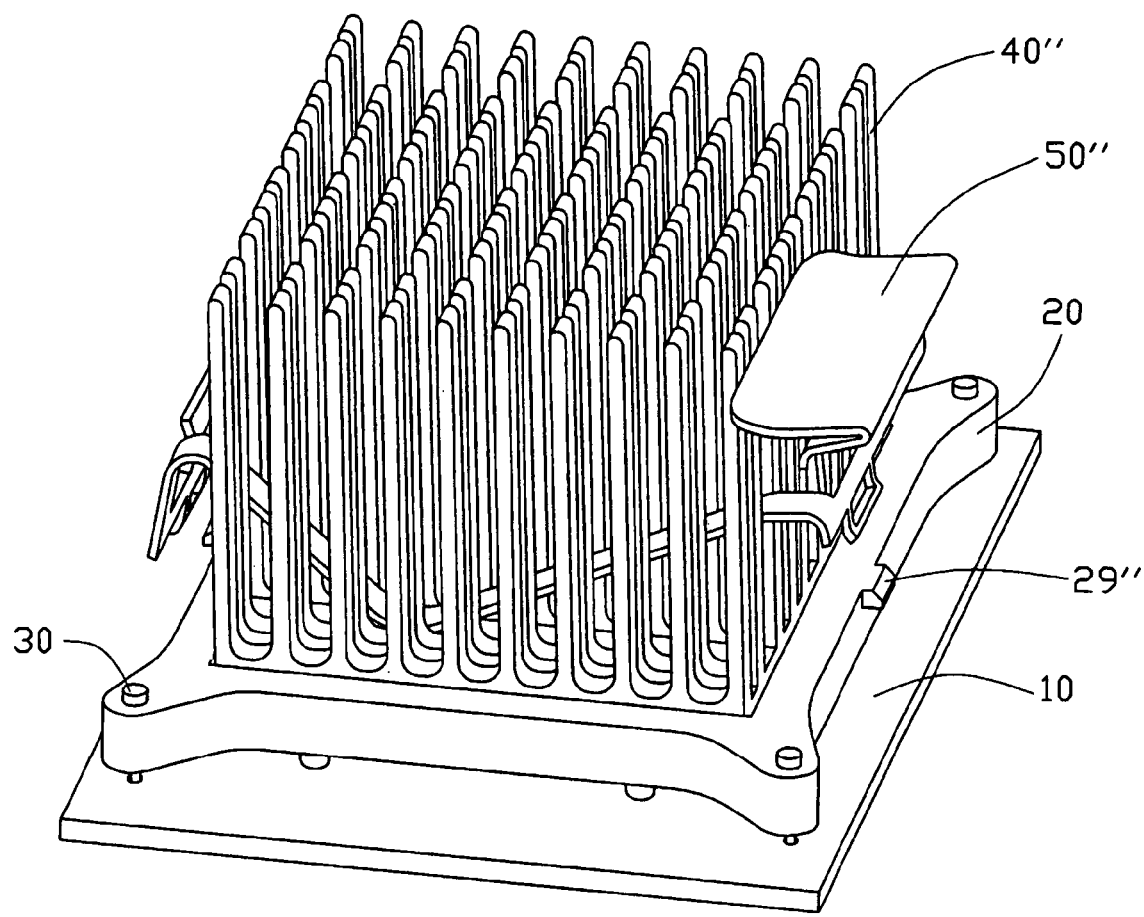
FIG. 6 is a substantially assembled view of FIG. 5.

FIGS. 5-6 show a heat sink assembly in accordance with a further alternative embodiment of the present invention. Said heat sink assembly is also similar to the heat sink assembly of the preferred embodiment, except for the following. A pair of symmetrical catches 29" is integrally formed outwardly from central portions of opposite sides of a retention module 20" respectively. A clip 50" is made of metallic material, and comprises a pair of pressing beams 52", a generally U-shaped leg 54" depending from respective ends of the pressing beams 52", and an operating portion 58" engaged between respective opposite ends of the pressing beams 52". A slot 542" is defined in the leg 54" and in the operating portion 58". In assembly, the pressing beams 52" are received in corresponding channels 46", and rest on a base 42" of a heat sink 40". The slot 542" of the leg 54" engagingly receives a corresponding catch 29" of the retention module 20". Then the operating portion 58" is depressed, causing the slot 542" thereof to engagingly receive an opposite catch 29" of the retention module 20".

It is to be understood, however, that even though numerous characteristics and advantages of the present invention have been set forth in the foregoing description, together with details of the structure and function of the invention, the disclosure is illustrative only, and changes may be made in detail, especially in matters of shape, size, and arrangement of parts within the principles of the invention to the full extent indicated by the broad general meaning of the terms in which the appended claims are expressed.

What is claimed is:

1. A heat sink assembly comprising:
   a printed circuit board having an electronic package mounted thereon;
   a retention module surrounding the electronic package, the retention module being integrally formed and defining two positioning holes at symmetrically opposite sides of a center thereof, the retention module defining an opening in a middle thereof;
   two pins positioned in the positioning holes and welded to the printed circuit board;
   a heat sink having a base received in the opening of the retention module and a rectangular array of pin fins extending upwardly from the base, parallel rows of the pin fins defining a plurality of parallel channels therebetween; and
   a clip cooperating with the retention module to press the beat sink against the electronic package, the clip comprising a pressing portion with at least a pressing beam received in at least a corresponding channel and resting on the base of the heat sink.

2. The beat sink assembly of claim 1, wherein the printed circuit board defines a pair of locating holes corresponding to the positioning holes of the retention module, and the pins are welded into the locating holes.

3. The heat sink assembly of claim 2, wherein each of the pins sequentially comprises a blocking portion, a connection portion and a welding portion, each of said portions sequentially having successively reduced diameters, the blocking portions abut against the retention module, the connecting portions are lodged in the positioning holes and the welding portions are welded into the locating holes of the printed circuit board.

4. The heat sink assembly of claim 1, wherein the pressing portion of the clip comprises a plurality of pressing beams received in a plurality of corresponding channels and resting on the base of the heat sink, and a pair of clamping portions engaging with a bottom face of the retention module.

5. The heat sink assembly of claim 4, wherein a plurality of standoffs extends from the retention module for isolating the retention module from the printed circuit board.

6. The heat sink assembly of claim 4, wherein the clip is made of plastic, the clamping portions extend from respective opposite sides of the pressing portion toward the printed circuit board, and the clamping portions form distal hooks engagingly clasping the bottom face of the retention module.

7. The heat sink assembly of claim 1, wherein the retention module is substantially rectangular, and the two positioning holes are defined in diagonally opposite corners of the retention module.

8. An electronic device comprising:
a printed circuit board having an electronic package mounted thereon;
a retention module surrounding the electronic package, the retention module being integrally formed, two pins extending from the retention module to the printed circuit board and being welded to the printed circuit board, the retention module defining an opening in a middle thereof;
a heat sink having a base received in the opening of the retention module and a rectangular array of pin fins extending upwardly from the base, parallel rows of the pin fins defining a plurality of parallel channels therebetween; and
a clip cooperating with the retention module to press the heat sink against the electronic package, the clip comprising at least a pressing beam received in at least a corresponding channel and resting on the base of the heat sink.

9. The heat sink assembly of claim 8, wherein the pins are disposed at symmetrically opposite sides of a center of the retention module.

10. The heat sink assembly of claim 8, wherein the pins are integrally formed from or welded to a portion of the retention module facing the printed circuit board.

11. The heat sink assembly of claim 8, wherein a pair of positioning holes is defined in the retention module, first ends of the pins are welded or interferentially received in the positioning holes, and opposite second ends of the pins are welded to the printed circuit board.

12. The heat sink assembly of claim 3, wherein the blocking portion of each of the pins abut against the retention module above a corresponding positioning hole of the retention module.

13. The heat sink assembly of claim 5, wherein the retention module extends a plurality of fixing arms outwardly, the pins extending trough corresponding fixing arms.

14. The heat sink assembly of claim 12, wherein each of the standoffs extends between two corresponding adjacent fixing arms from the retention module.

15. The electronic device of claim 8, wherein the pins extend through two corresponding positioning holes defined in the retention module, each of the pins comprising a blocking portion abutting against the retention module above the corresponding positioning hole, a connecting portion received in the corresponding hole, and a welding portion welded to the printed circuit board.

16. The electronic device of claim 8, wherein the retention module extends a plurality of standoffs from a bottom thereof each of the standoffs being located between two corresponding adjacent corners of the retention module.

* * * * *